United States Patent
Shono et al.

[11] Patent Number: 5,559,818
[45] Date of Patent: Sep. 24, 1996

[54] SEMICONDUCTOR LASER DEVICE

[75] Inventors: Masayuki Shono; Ryoji Hiroyama; Keiichi Yodoshi, all of Osaka, Japan

[73] Assignee: Sanyo Electric Co., Ltd., Moriguchi, Japan

[21] Appl. No.: 312,696

[22] Filed: Sep. 27, 1994

[30] Foreign Application Priority Data

Mar. 24, 1994 [JP] Japan .................. 6-054171

[51] Int. Cl.$^6$ ............... H01S 3/18; H01L 33/00
[52] U.S. Cl. ................... 372/45; 257/18; 257/96
[58] Field of Search .................. 372/45; 257/18, 257/96

[56] References Cited

U.S. PATENT DOCUMENTS

| | | | |
|---|---|---|---|
| 5,132,981 | 7/1992 | Uomi et al. | 372/45 |
| 5,146,466 | 9/1992 | Hamada et al. | 372/45 |
| 5,181,086 | 1/1993 | Yoshida | 257/18 |
| 5,373,166 | 12/1994 | Buchan et al. | 257/18 |

FOREIGN PATENT DOCUMENTS 2-310985  12/1990  Japan .
3-21095   1/1991   Japan .

OTHER PUBLICATIONS

Briggs et al., "Gain and Threshold Characteristics of Strain-—Compensated Multiple–Quantum–Well Lasers", IEEE Phot. Tech. Letters, vol. 4, No. 5, May 1992.

Primary Examiner—Rodney B. Bovernick
Assistant Examiner—Robert McNutt
Attorney, Agent, or Firm—Darby & Darby, P.C.

[57] ABSTRACT

The present invention is directed to a semiconductor laser device in which an active layer is constituted by a quantum well layer having a structure in which well layers and barrier layers which are formed on a GaAs substrate are alternately layered, cladding layers are provided so as to interpose the active layer, the value of a strain on each of the well layers is −0.8% to −1.5%, the thickness of a well layer is from 80 Å to 180 Å, the value of strain on each of the barrier layers is +0.5% to +1.0%, the thickness of the barrier layer is 20 Å to 60 Å, and the respective numbers of layered well layers and barrier layers are 2 to 4.

17 Claims, 8 Drawing Sheets

SEMICONDUCTOR LASER DEVICE

BACKGROUND OF THE INVENTION

1. Field of the Invention

The present invention relates generally to a semiconductor laser device comprising an active layer having a strain compensated type multiple quantum well structure, and more particularly, to a semiconductor laser device having an oscillation wavelength in the range of about 630 nm.

DESCRIPTION OF THE PRIOR ART

As a light source for recording and reading to and from an optical disk or the like or a light source of a laser printer or the like, demand for a semiconductor laser device oscillating in a wavelength in a visible-light region has been increased. Examples of this type of visible-light laser currently used include a semiconductor laser device comprising an active layer having a multiple quantum well structure on a GaAs substrate.

In the above described visible-light laser, it is demanded that the oscillation wavelength thereof is decreased. A semiconductor laser of an AlGaInP system oscillating in a band of 630 nm is of interest to. The decrease in the wavelength makes it possible to significantly improve the recording density in the optical disk or the like and to replace the semiconductor laser of an AlGaInP system with a He—Ne gas laser having an oscillation wavelength (λ) of 630 nm.

In the semiconductor laser of an AlGaInP system oscillating in a band of 630 nm, therefore, it is proposed that a strain multiple quantum well (S-MQW) structure is employed for an active layer which is set into laser oscillation for purposes of improving laser characteristics, for example, decreasing an operating current and improving temperature characteristics. This structure is a structure in which the composition of a well layer having a multiple quantum well structure is changed and the lattice constant of crystals of the well layer is changed to exert a compressive strain or a tensile strain on the well layer.

It is known that such exertion of the strain on the well layer having the quantum well structure leads to an improvement of laser characteristics such as decreases in threshold current and operating current, in addition to an improvement of characteristics due to the quantum well structure. The larger the value of the strain, the more the laser characteristics are improved. If too large a strain is exerted, however, crystal defects occur, so that the characteristics are conversely degraded. The larger the value of the strain and the larger the layer thickness, the greater is the likelihood that crystal defects can easily occur.

In order to improve the characteristics of the strain multiple quantum well semiconductor laser, therefore, a strain compensated type MQW structure capable of exerting strains in the opposite directions on a well layer and a barrier layer and exerting the large strain on the well layer has been proposed, for example as disclosed in Japanese Patent Laid-Open Gazette No. 21093/1991.

In the above described conventional strain compensated type MQW structure, the strains are so set that the values of the compressive strain and the tensile strain are approximately equal to each other (the average value of the strains is approximately zero). The inventors of the present application have examined the relationship between strains exerted on the well layer and the barrier layer and a threshold current. As a result, it is found that a sufficient effect to improve laser characteristics cannot be obtained merely by so setting the strains that the values of the compressive strain and the tensile strain are approximately equal to each other as in the conventional example.

SUMMARY OF THE INVENTION

The present invention has been made so as to solve the above described conventional problems and has for its object to improve laser characteristics by optimizing strains respectively exerted in the opposite directions on a well layer and a barrier layer and exert the large strain on the well layer.

Additionally, an object of the present invention is to decrease the threshold current of a semiconductor laser device having an oscillation wavelength of 630 nm.

In a semiconductor laser device in which an active layer is constituted by a quantum well structure having a structure of a well layer and a barrier layer which are formed on a semiconductor substrate, and cladding layers are provided so as to interpose the active layer, the present invention is characterized in that in a case where the value of a strain in the well layer, $\Delta a_{wi}$, is defined as $\Delta a_{wi} = (a_{wi} - a)/a$, the value of a strain on the barrier layer, $\Delta a_{bj}$, is defined as $\Delta a_{bj} = (a_{bj} - a)/a$, and the product of strain accumulated in the active layer and the layer thickness, A, is calculated by the following equation:

$$\Delta = \sum_{i=1}^{n} \Delta a_{wi} \times t_{wi} + \sum_{j=1}^{m} \Delta a_{bj} \times t_{wj},$$

where a is the lattice constant of the semiconductor substrate, $a_{wi}$ is the lattice constant of the well layer, $t_{wi}$ is the thickness of the well layer, $a_{bj}$ is the lattice constant of the barrier layer, and $t_{bj}$ is the thickness of the barrier layer, the foregoing $\Delta a_{wi}$, $\Delta a_{bj}$ and $\Delta$ satisfy the following relationships:

$-2.0\% \leq \Delta a_{wi} < 0\%$,
$0\% < \Delta a_{bj} \leq +1.5\%$, and
$-3.6 \times 10^{-10}$ (meter) $\leq \Delta < 0$, or
$0\% < \Delta a_{wi} \leq 2.0\%$,
$-1.5\% \leq \Delta a_{bj} < 0\%$, and
$0 < \Delta \leq 3.6 \times 10^{-10}$ (meter).

The threshold current of the semiconductor laser device is decreased by setting the value of the strain on the well layer, the value of the strain on the barrier layer, and the product of the strains accumulated in the active layer and the layer thickness as described above, thereby to make it possible to improve the efficiency and improve the temperature characteristics.

Furthermore, in a semiconductor laser device in which an active layer is constituted by a quantum well structure having a structure in which well layers and barrier layers which are formed on a semiconductor substrate are alternately layered, and cladding layers are provided so as to interpose the active layer, the present invention is characterized in that the value of a strain on each of the well layers is –0.8% to –1.5%, the thickness of the well layer is 80 Å to 180 Å, the value of a strain on each of the barrier layers is +0.5% to +1.0%, the thickness of the barrier layer is 20 Å to 60 Å, and the respective numbers of laminated well layers and barrier layers are 2 to 4.

The threshold current of the semiconductor laser device oscillating in a band of 630 nm is decreased by setting the strain values and the layer thicknesses as described above, thereby to make it possible to improve the efficiency and improve the temperature characteristics.

DESCRIPTION OF THE PREFERRED EMBODIMENTS

Description is now made of embodiments of the present invention with reference to the drawings.

Figure 1:
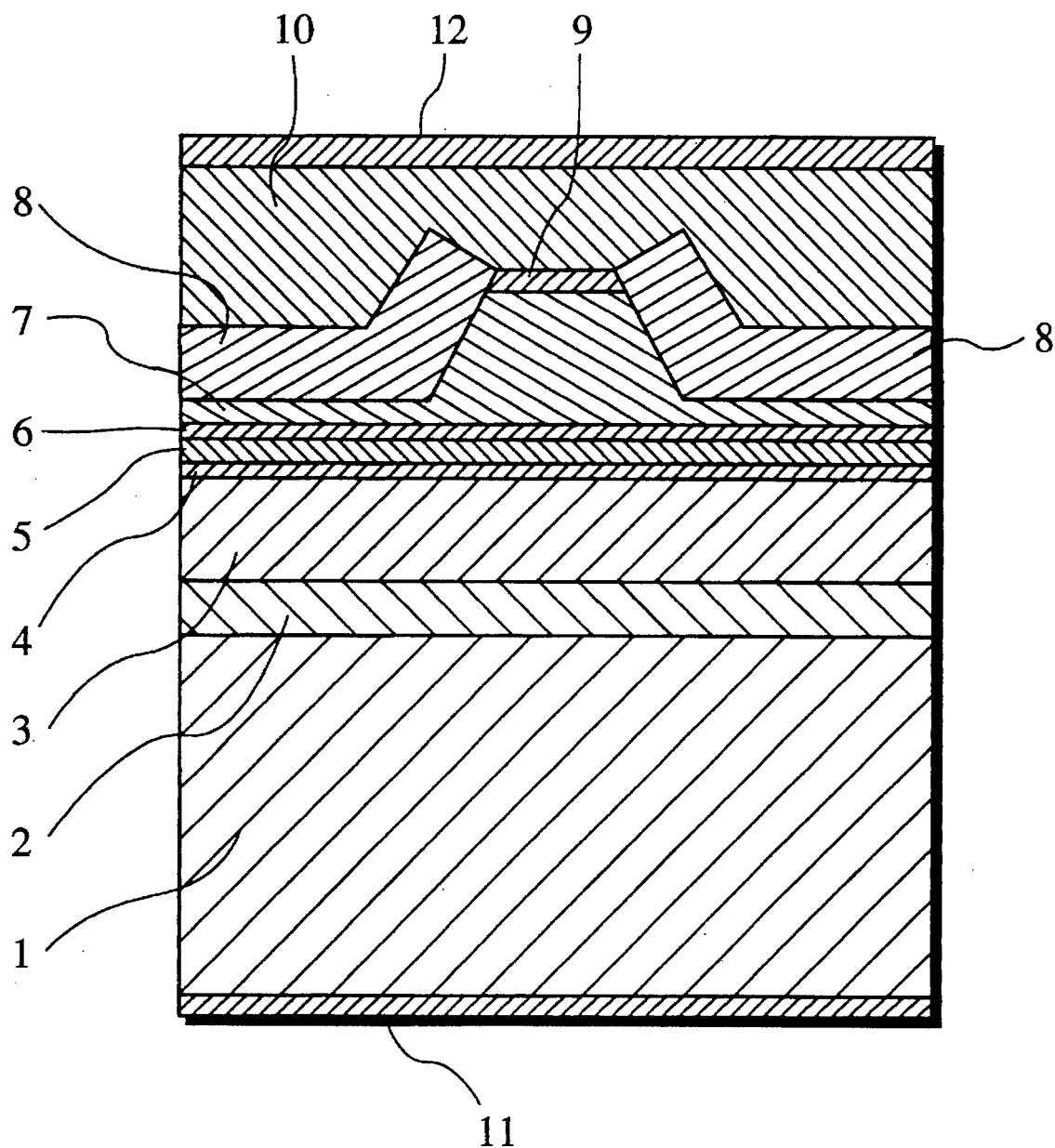
FIG. 1 is a cross sectional view showing a semiconductor device according to a first embodiment of the present invention.
Figure 2:
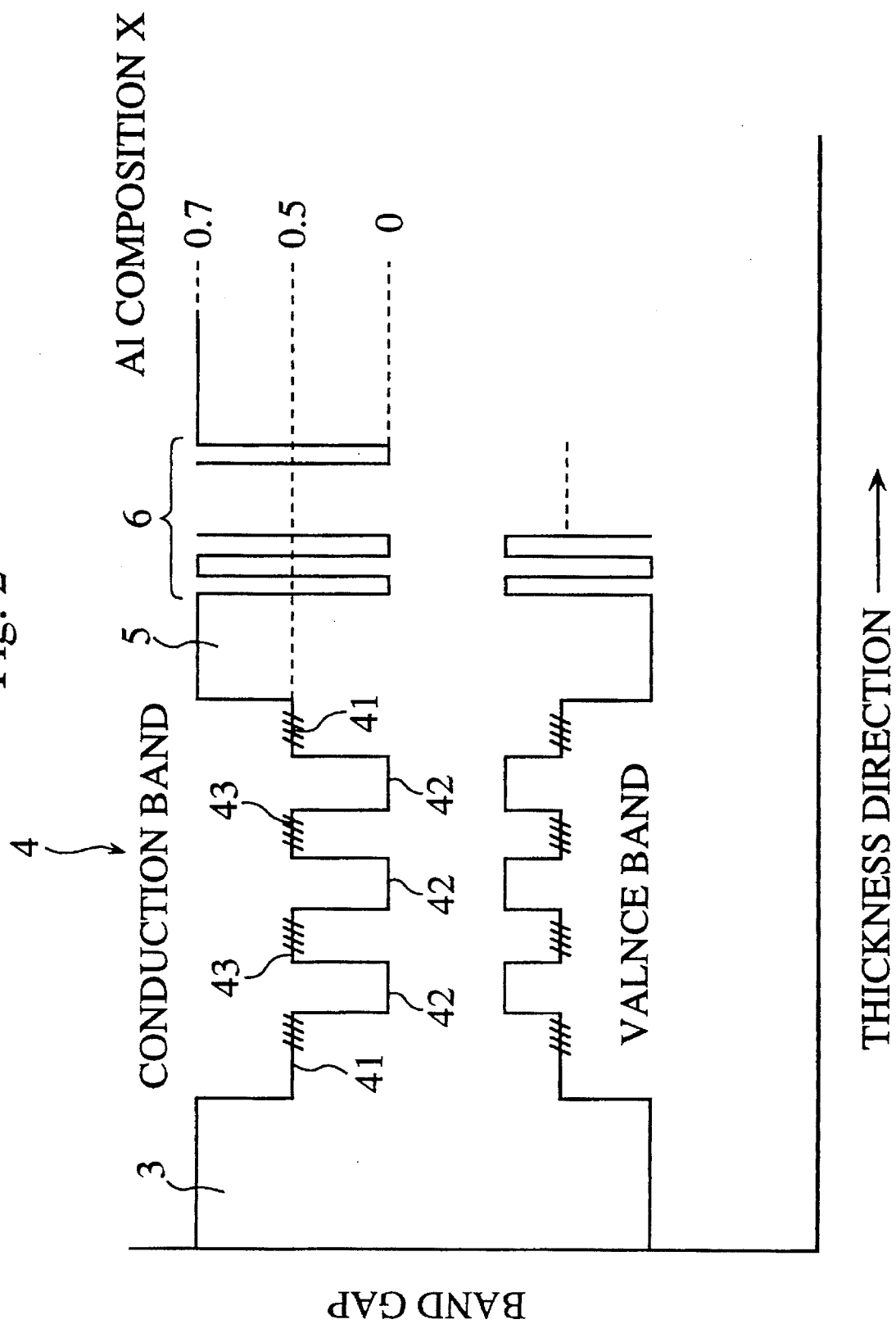
FIG. 2 is a schematic view showing a band structure in the vicinity of an active layer in the present invention.

FIG. 1 is a cross sectional view showing a semiconductor laser device according to a first embodiment of the present invention, and FIG. 2 is a schematic view showing a band structure in the vicinity of an active layer.

A device according to a first embodiment is a semiconductor laser device having a buried ridge structure. In this semiconductor laser device, a buffer layer 2 composed of n-type $Ga_{0.51}In_{0.49}P$ having a thickness of 0.3 &Lm and a cladding layer 3 composed of n-type $(Al_xGa_{1-x})_{0.51}In_{0.49}P (0.5<x<1: x=0.7$ in the present embodiment) having a thickness of 0.8 μm are sequentially grown on an n-type GaAs substrate 1 having a main surface misoriented by 9° from a (100) plane of the substrate in a [011] direction by a metal organic chemical vapor deposition (MOCVD) method, a molecular beam epitaxy (MBE) method or the like. An active layer 4 having a strain compensated type MQW structure which characterizes the present invention is formed on the cladding layer 3 by the MOCVD method or the like. A cladding layer 5 composed of p-type $(Al_xGa_{1-x})_{0.51}In_{0.49}P(0.5<x<1: x=0.7$ in the present embodiment) having a thickness of 200 Å and a multiple quantum barrier 6 for improving temperature characteristics are formed on the active layer 4, and a cladding layer 7 composed of p-type $(Al_{0.7}Ga_{0.3})_{0.51}In_{0.49}P$ having a thickness of 0.8 μm is further formed thereon by the MOCVD method or the like.

The cladding layer 7 is provided with a projection having a thickness of 5 μm by mesa etching or the like, and a block layer 8 composed of n-type GaAs having a thickness of 0.8 μm is formed on the cladding layer 7 excluding an upper surface portion of the projection. In addition, a contact layer 9 composed of p-type $Ga_{0.51}In_{0.49}P$ having a thickness of 0.1 μm is formed in the projection, and a cap layer 10 composed of p-type GaAs having a thickness of 3 μm is formed on the entire surface of the contact layer 9. A p-type electrode 12 and an n-type electrode 11 are respectively formed on the cap layer 10 and the lower surface of the n-type substrate 1.

Description is now made of the active layer 4 which characterizes the present invention with reference to FIG. 2. The active layer 4 according to the present invention is constituted by well layers 42, barrier layers 43, and optical guide layers 41 (which function as barrier layers for the well layers 42).

As shown in FIG. 2, the active layer 4 constituted by a strain multiple quantum well layer comprising pairs of well layers 42 and barrier layers 43 which has a composition of $(Al_xGa_{1-x})_yIn_{y-1}P$ (0<x<1, 0.24<y<0.78) is provided between the optical guide layers 41 having a thickness of 150 Å from the n-type cladding layer 3 using the MOCVD method, the MBE method or the like.

In the present embodiment, the composition ratio of y in the composition of $(Al_xGa_{1-x})_yIn_{y-1}P$ is so adjusted that a tensile strain (having a negative value) is exerted on the well layers 42 and a compressive strain is exerted on the barrier layers 43. Specifically, lattice matching is achieved so that there is no strain when y is 0.51, a compressive strain is exerted when y is less than 0.51, and a tensile strain is exerted when y is more than 0.51. In FIG. 2, the compressive strain is exerted on a hatched portion.

Furthermore, the multiple quantum barrier 6 is preferably constituted by 10 pairs of well layers composed of $Ga_{0.51}In_{0.49}P$ having a thickness of 11 Å and barrier layers composed of $(Al_{0.7}Ga_{0.3})_{0.51}In_{0.49}P$ having a thickness of 17 Å.

Figure 3:
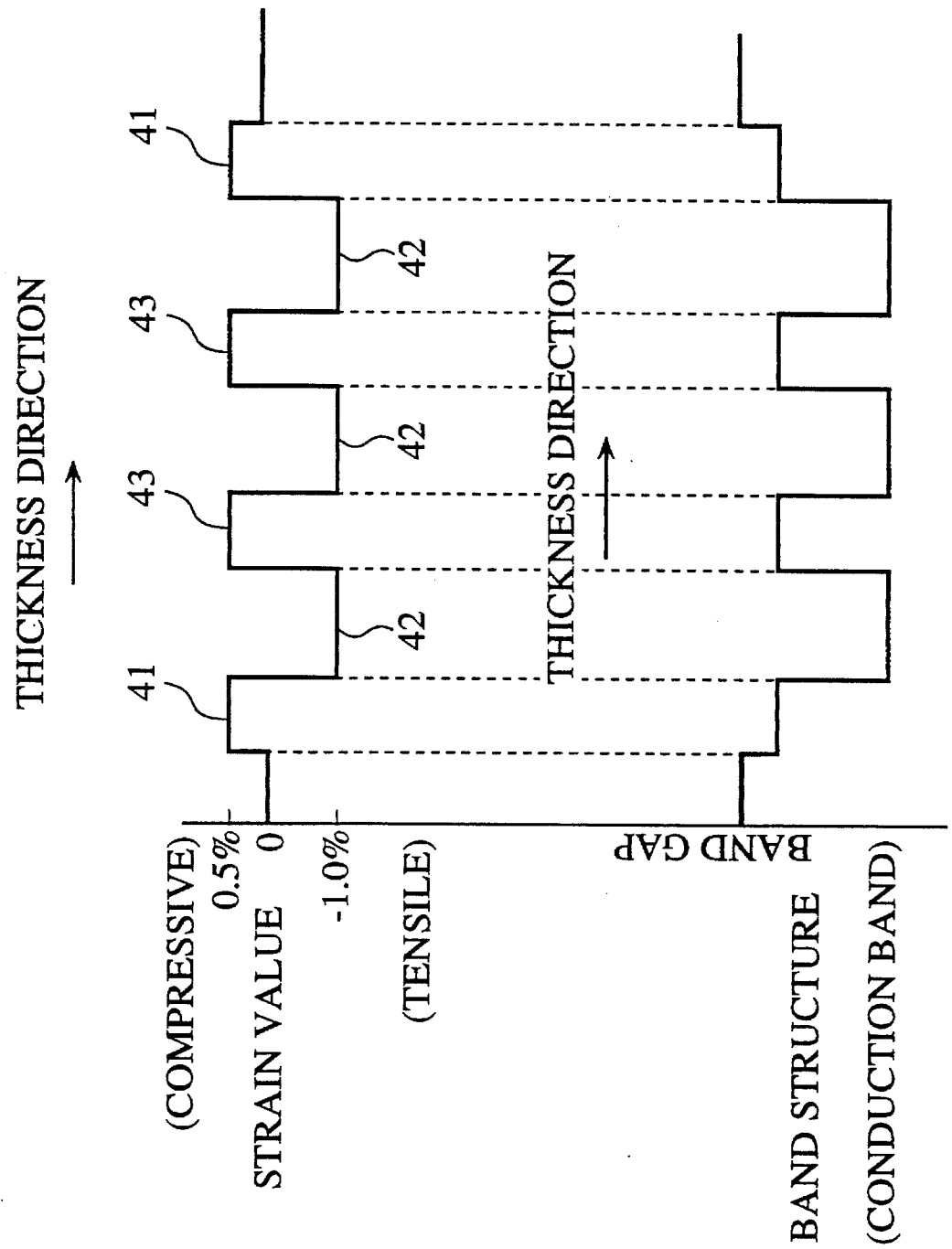
FIG. 3 is a schematic view showing the relationship between strain values and a band gap.

FIG. 3 is a diagram showing the relationship between strain values and band gap. As apparent from FIG. 3, in the case of the same Al composition, the band gap is decreased in the case of a positive strain value, that is, a compressive strain, while being increased in the case of a negative strain value, that is, a tensile strain.

Figure 4:
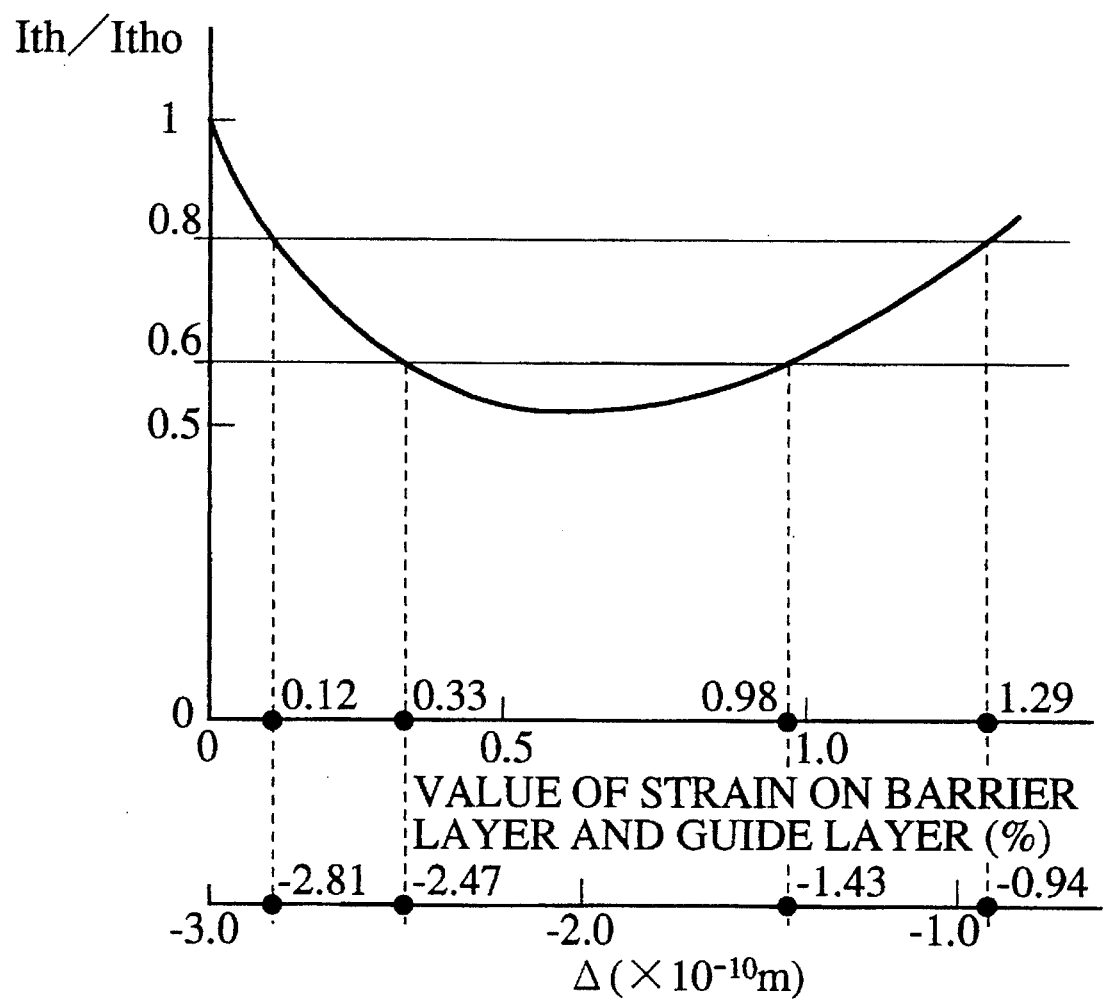
FIG. 4 is a graph showing the relationship between strain values and a threshold current.
Figure 5:
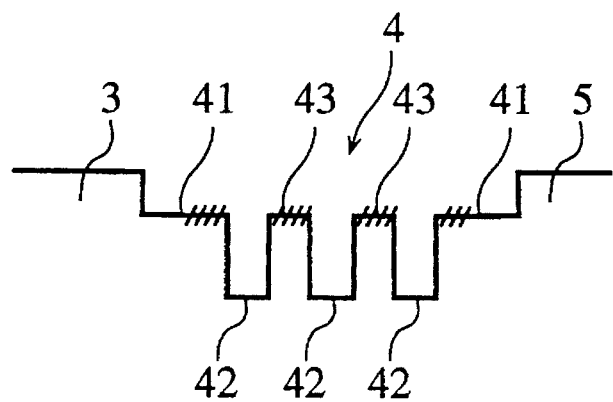
FIG. 5 is a schematic view showing a band structure in an active layer of a laser device used for the measurements shown in FIG. 4.
Figure 6:
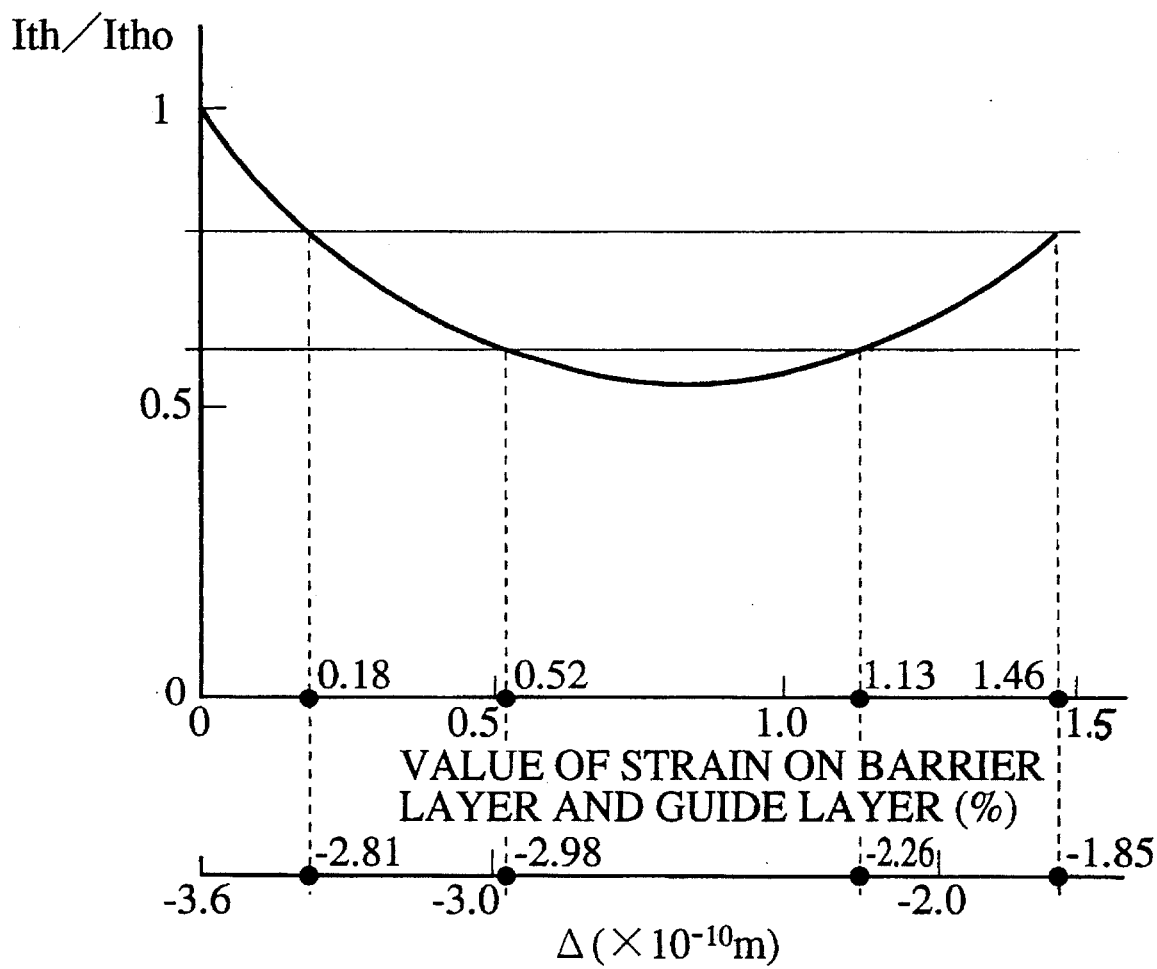
FIG. 6 is a measured diagram showing the relationship between strain values and a threshold current.

The inventors of the present application have changed the strain value into a variety of values in the above described semiconductor laser device having the structure shown in FIGS. 1 and 2, to measure the threshold current. The results of the measurements are shown in FIGS. 4 and 6. FIG. 4 is a diagram showing the results of the measurements of the threshold current using a semiconductor laser device comprising an active layer 4 having a structure shown in FIG. 5. As shown in FIG. 5, this active layer comprises three well layers 42 each having a thickness of 100 Å, the value of a strain on the well layers 42 is set to −1%, and the thickness of barrier layers 43 and optical guide layers 41 is set to 40 Å, to change the value of strain on the barrier layers 43 and the optical guide layers 41. The oscillation wavelength of the semiconductor laser device at this time is 635 nm.

The strain values are defined as follows in a case where a is taken as the lattice constant of the semiconductor substrate 1, $a_{wi}$ is taken as the lattice constant of the well layers 42, $t_{wi}$ is taken as the thickness of the well layers 42, $a_{bj}$ is taken as the lattice constant of the barrier layers 43 and the optical guide layers 41, and $t_{bj}$ is taken as the thickness of the barrier layers 43 and the optical guide layers 41: The value of the strain on the well layers 42, $\Delta a_{wi}$, is defined as $\Delta a_{wi}=(a_{wi}-a)/a$, and the value of the strain on the barrier layers 43 and the optical guide layers 41, $\Delta a_{bj}$, is defined as $\Delta a_{bj}=(a_{bj}-a)/a$.

Furthermore, the product of the strains accumulated in the active layer 4 and the layer thickness ($t_{wi}$ and $t_{wj}$), $\Delta$, is calculated as follows:

$$\Delta = \sum_{i=1}^{n} \Delta a_{wi} \times t_{wi} + \sum_{j=1}^{m} \Delta a_{bj} \times t_{wj}.$$

In FIG. 4, the abscissa represents the value of the strain on the barrier layers 43 and the optical guide layers 41, $\Delta a_{bj}$, and the product of the strains accumulated in the active layer and the layer thickness, $\Delta$, and the ordinate represents the ratio (Ith/Itho) of the threshold current (Ith) to a threshold value at the time of exerting a strain of −1.0% on only the well layers 42 (Itho). As can be seen from FIG. 4, the ratio takes the minimum value when the value of the strain exerted on the barrier layers 43 and the optical guide layers 41 is 0.6% and the product $\Delta$ is in the vicinity of $-2.0 \times 10^{-10}$ (meter).

Specifically, the threshold current is decreased as the value of the strain exerted on the barrier layers 43 and the optical guide layers 41 is increased to 0.6%. The threshold current takes the minimum value when it is in the vicinity of 0.6%, and is increased as it is increased from 0.6%. Consequently, the optimum value exists as the value of the strain $\Delta a_{bj}$ on the barrier layers 43 and the optical guide layers 41.

The range is $0\% < \Delta a_{bj} \leq 1.29\%$.

Preferably, the range is $0.12 \leq \Delta a_{bj} \leq 1.29\%$.

More preferably, the range is $0.33 \leq \Delta a_{bj} \leq 0.98\%$.

Figure 7:
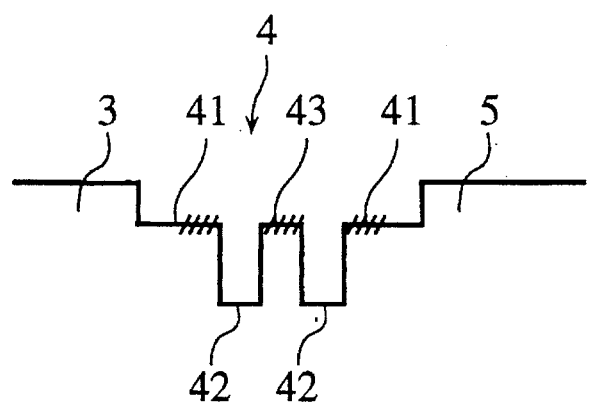
FIG. 7 is a schematic view showing a band structure in an active layer of a laser device used for the measurements shown in FIG. 6.

FIG. 6 is a diagram showing the results of the measurements of the threshold current using a semiconductor laser device comprising an active layer 4 having a structure shown in FIG. 7. In this example, the active layer 4 comprises two well layers 42 each having a thickness of 150 Å, and the value of a strain on the well layers 42 is −1.2%, to change the value of a strain on barrier layers 43 and optical guide layers 41. The oscillation wavelength of the semiconductor laser device at this time is 635 nm.

The ordinate and the abscissa in FIG. 6 are the same as those shown in FIG. 4. In FIG. 6, the threshold current is decreased as the value of the strain on the barrier layers 42 and the optical guide layers 41, $\Delta a_{bj}$, is increased to 0.8% ($\Delta$: $-2.6 \times 10^{-10}$ m), takes the minimum value when it is in the vicinity of 0.8%, and is increased as it is increased from 0.8%, as in FIG. 4. In this example, therefore, the range of the strain value, $\Delta a_{bj}$, is as follows:

The range is $0\% < \Delta a_{bj} \leq 1.5\%$.

Preferably, the range is $0.18 \leq \Delta a_{bj} \leq 1.46\%$.

More preferably, the range is $0.52 \leq \Delta a_{bj} \leq 1.13\%$.

The optimum values can be thus respectively determined as, for example, the values of the strains on the active layer 4. However, the value of the strain which can be exerted as the strain on the well layers 42, $\Delta a_{wi}$, is $-2\% \leq \Delta a_{wi} < 0\%$. Respective parameters suitable for the active layer 4 are as follows from the strain values and the above described FIGS. 4 and 6:

$-2\% \leq \Delta a_{wi} < 0\%$,
$0\% < \Delta a_{bj} \leq +1.5\%$, and
$-3.6 \times 10^{-10}$ (meter) $\leq \Delta < 0$.
Preferably,
$-3.38 \times 10^{-10}$ (meter) $\leq \Delta \leq -0.94 \times 10^{-10}$ (meter).

More preferably,
$-2.98 \times 10^{-10}$ (meter) $\leq \Delta \leq -1.43 \times 10^{-10}$ (meter).

Although in the above described embodiment, the tensile strain is exerted on the well layers 42 and the compressive strain is exerted on the optical guide layers 41 and the barrier layers 43, the compressive strain may be exerted on the well layers 42 and the tensile strain may be exerted on the optical guide layers 41 and the barrier layers 43, in which case the function of respectively compensating for the strains by the well layers 42 and by the barrier layers 43 and the optical guide layers 41 is the same, thereby to make it possible to increase the values of the strains on the quantum well layer. In addition, whichever of the compressive strain and the tensile strain is exerted on the barrier layers 43 and the optical guide layers 41, the diffusion speed of holes in the barrier layers 43 and the optical guide layers 41 is increased, thereby to make it possible to uniformly inject carriers to the respective well layers 42, which is effective in decreasing the threshold current. The threshold current is decreased in the same function whether the tensile strain is exerted on the well layers 42 and the compressive strain is exerted on the optical guide layers 41 and the barrier layers 43 or the compressive strain is exerted on the well layers 42 and the tensile strain is exerted on the optical guide layers 41 and the barrier layers 43, so that the values of the strains are in the same range. Consequently, respective parameters are preferably in the same ranges as the above described ranges even when the compressive strain is exerted on the well layers 42 and the tensile strain is exerted on the optical guide layers 41 and the barrier layers 43:

That is,
$0\% < \Delta a_{wi} \leq 2\%$,
$-1.5\% \leq \Delta a_{bj} < 0\%$, and
$0 < \Delta \leq 3.6 \times 10^{-10}$ (meter).
Preferably,
$0.94 \times 10^{-10}$ (meter) $\leq \Delta \leq 3.38 \times 10^{-10}$ (meter).
More preferably,
$1.43 \times 10^{-10}$ (meter) $\leq \Delta \leq 2.98 \times 10^{-10}$ (meter).

Suitable ranges are then calculated on the basis of FIGS. 4 and 6 in the above described structure shown in FIGS. 1 and 2 when the oscillation wavelength is 635 nm. Consequently, the value of the strain on the well layers 42 is −0.8% to −1.5%, the thickness of one of the well layers 42 is 80 to 180 Å, the number of pairs of well layers and barrier layers is 2 to 4, the value of the strain on the barrier layers 43 and the optical guide layers 41 is +0.5% to +1.0%, and the thickness of one of the barrier layers 43 is 20 to 60 Å. The semiconductor laser device thus formed is low in threshold current and oscillates in a wavelength of 635 nm.

Figure 8:
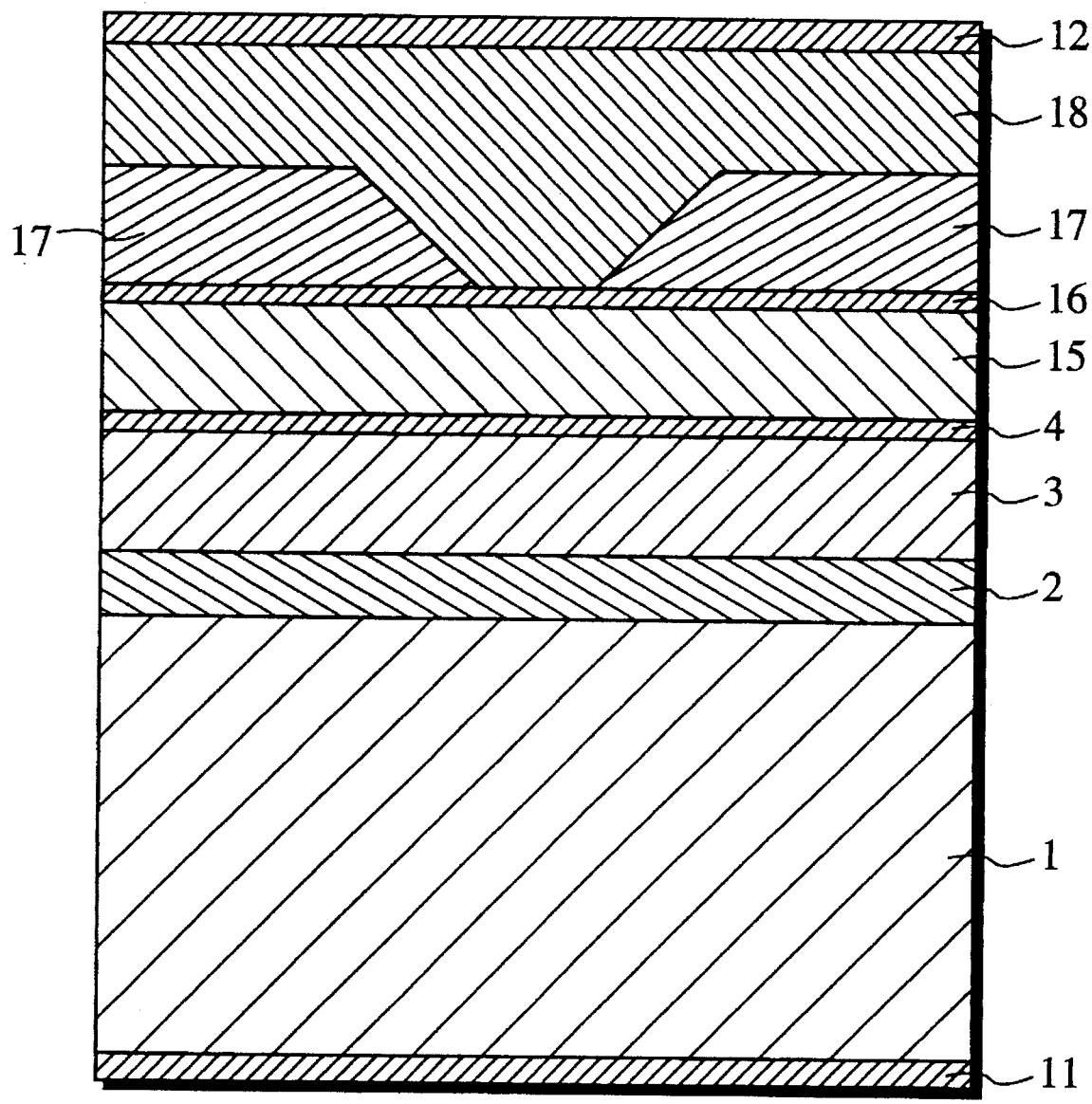
FIG. 8 is a cross sectional view showing a semiconductor device according to a second embodiment of the present invention.

Although the above described embodiment shown in FIG. 1 is directed to a semiconductor laser device having a buried ridge structure, the present invention is applicable to a semiconductor laser device having a strain compensated type MQW structure for an active layer. For example, the present invention is applicable to semiconductor laser devices shown in FIGS. 8 to 10. FIG. 8 shows a semiconductor laser device having an inner stripe structure. In this semiconductor laser device, a buffer layer 2 composed of n-type $Ga_{0.51}In_{0.49}P$ having a thickness of 0.3 μm and a cladding layer 3 composed of n-type $(Al_{0.7}Ga_{0.3})_{0.51}In_{0.49}P$ having a thickness of 0.8 μm are sequentially grown on an n-type GaAs substrate 1 having a main surface misoriented by 9° from a (100) plane of the substrate in a [011] direction by a MOCVD method or the like, and an active layer 4 having a strain compensated type MQW structure which characterizes the present invention is formed on the cladding layer 3 by the MOCVD method or the like. A cladding layer 15 composed of p-type $(Al_xGa_{1-x})_{0.51}In_{0.49}P(0.5<x<1$: x=0.7 in the present embodiment) having a thickness of 0.8 μm is formed on the active layer 4, and a contact layer 16 composed of p-type $Ga_{0.51}In_{0.49}P$ having a thickness of 0.1 μm is formed thereon respectively by the MOCVD method or the like. A block layer 17 composed of n-type GaAs having a thickness of 0.8 μm is formed on the contact layer 16. The block layer 17 is etched away so as to expose the surface in the center of the contact layer 16. A cap layer 18 composed of p-type GaAs having a thickness of 3 μm is formed on the block layer 17 including the contact layer 16. A p-type electrode 12 is formed on the cap layer 18, and an n-type electrode 11 is formed on the lower surface of the n-type substrate 1.

Figure 9:
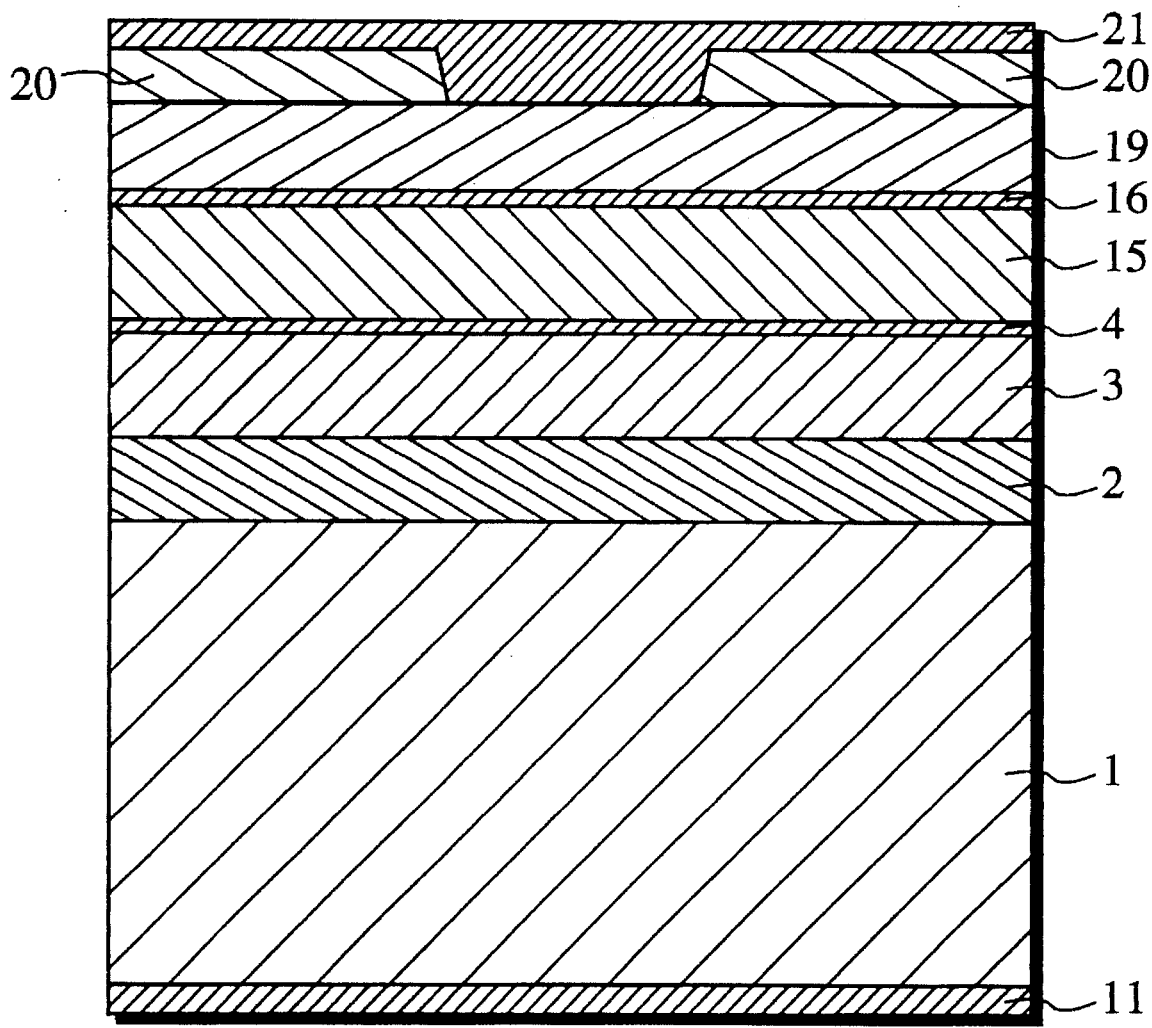
FIG. 9 is a cross sectional view showing a semiconductor device according to a third embodiment of the present invention.

FIG. 9 shows a semiconductor laser device having an oxide stripe structure, which is formed similarly to the above described semiconductor laser device having an inner current bottleneck structure until a contact layer 16 is formed. A cap layer 19 composed of p-type GaAs having a thickness of 0.5 μm is provided on the contact layer 16, an $SiO_2$ film 20 having a thickness of 0.5 μm is provided on the cap layer 19. The $SiO_2$ film 20 is removed in a stripe shape by etching to expose the cap layer 19. A p-type electrode 21 is formed on the exposed cap layer 19.

Figure 10:
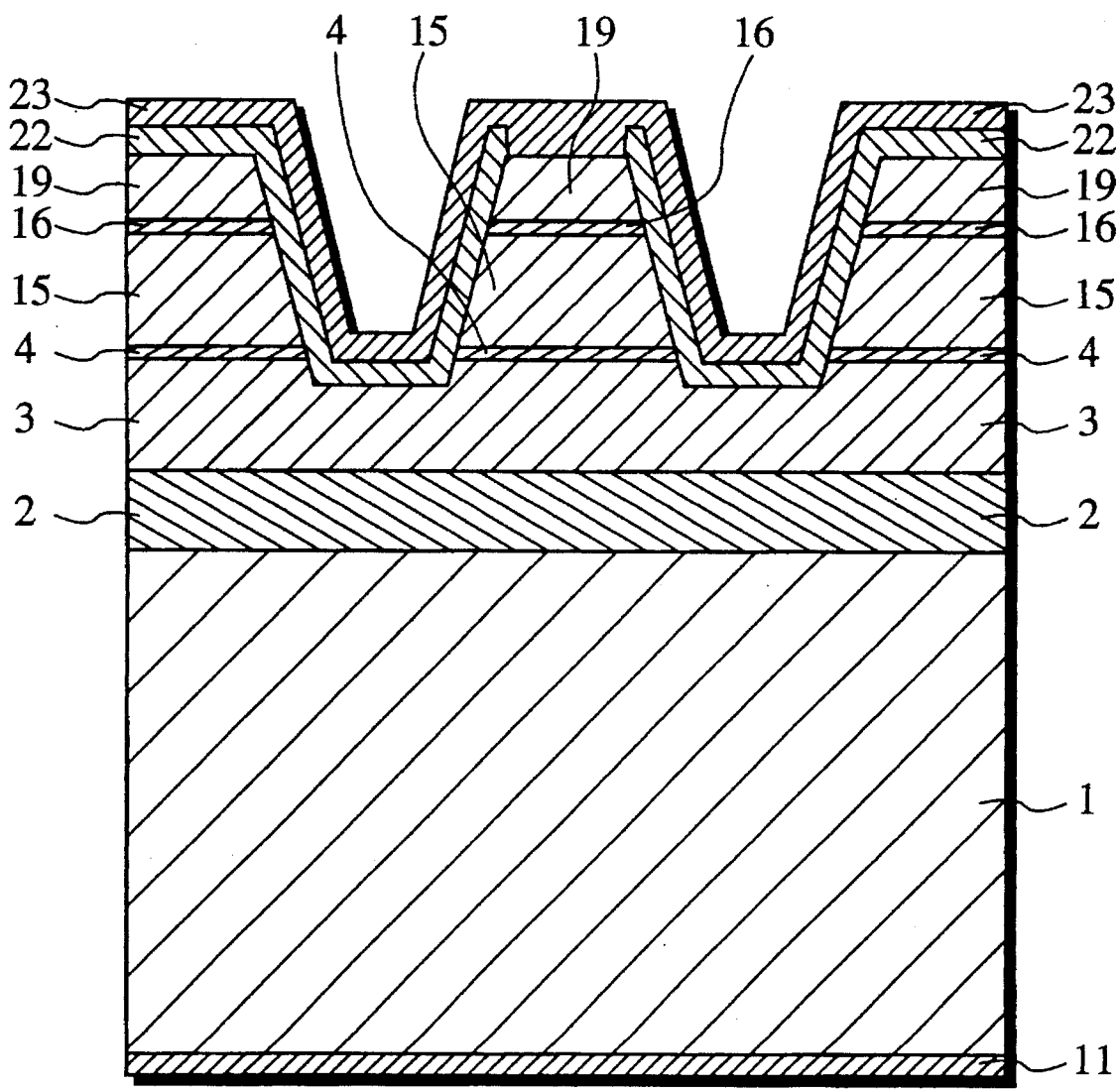
FIG. 10 is a cross sectional view showing a semiconductor device according to a fourth embodiment of the present invention.

FIG. 10 shows a semiconductor laser device having a ridge structure, which is formed similarly to the above described semiconductor laser device having an oxide strip structure until a cap layer 19 is formed. Thereafter, mesa etching is made until the etching depth reaches a cladding layer 3. A portion excluding a p-type electrode 23 and a contact region is coated with a $SiO_2$ film 22, and an p-type electrode 23 is formed thereon.

The present invention is applied to an active layer 4 of each of the semiconductor laser devices thus formed, thereby to obtain the same effect.

Furthermore, although in the above described embodiments, description was made using a device having an oscillation wavelength of 635 nm, a laser device having another wavelength may be used provided that it is made of the same material, in which case the same effect is obtained.

Additionally, although a device structure is described using a refractive index waveguide type device, it will be clear that the same effect is obtained with respect to a gain waveguide type device, a broad area type (wide stripe type) device or a laser array. In addition, the effect of the present invention is independent of the presence or absence of a multiple quantum barrier or an etching stopper layer. The same effect can be expected even when an active layer does not have a multiple quantum structure but a single quantum well structure.

Furthermore, although the above described embodiments used the n-type GaAs substrate 1 having a main surface misoriented by 9° from the (100) plane in the [011] direction, the effect of the present invention is obtained without depending on the off angle. If the one main surface of the GaAs substrate 1 is misoriented by not less than 5° from the (100) plane in the [011] direction, the crystallizability of the layer grown on the substrate becomes good. On the other hand, if the off angle exceeds 17°, the crystallizability of the layer formed on the substrate is degraded. In addition, although in the above described embodiments, the one main surface of the GaAs substrate 1 is misoriented from the (100) plane in the [011] direction, the same effect is obtained if the one main surface of the GaAs substrate 1 is a surface equivalent to the surface misoriented from the (100) plane in the [011] direction. Specifically, one main surface (a crystal grown plane) of the GaAs substrate may be a surface misoriented from a (100) plane of the substrate in a [0-1-1] direction, a surface misoriented from a (010) plane of the substrate in a [101] or [-10-1] direction, or a surface misoriented from a (001) plane of the substrate in a [110] or [-1-10] direction, that is, a surface misoriented from a {100} plane of the substrate in a <011> direction. Consequently, with the GaAs substrate 1 used, a GaAs substrate having a main surface misoriented by not less than 5° from a {100} plane of the substrate in a <011> direction is preferable, and a GaAs substrate having a main surface misoriented by not less than 5° nor more than 17° from a {100} plane of the substrate in a <011> direction is more preferable.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a semiconductor laser device comprising an active layer including a quantum well structure having a layered structure of a well layer and a barrier layer formed on a semiconductor substrate, and cladding layers provided with the active layer interposed therebetween, wherein the value of strain in said well layer, $\Delta a_{wi}$, is defined as $\Delta a_{wi}=(a_{wi}-a)/a$, the value of strain in said barrier layer, $\Delta a_{bj}$, is defined as $\Delta a_{bj}=(a_{bj}-a)/a$, and the product of strain accumulated in said active layer and the layer thickness ($t_{wi}$ and $t_{bj}$), $\Delta$, is calculated by the following equation:

$$\Delta = \sum_{i=1}^{n} \Delta a_{wi} \times t_{wi} + \sum_{j=1}^{m} \Delta[a_{bi}] \underline{a}_{bj} \times t_{bj},$$

where a is the lattice constant of said semiconductor substrate, $a_{wi}$ is the lattice constant of said well layer, $t_{wi}$ is the thickness of the well layer, $a_{bj}$ is the lattice constant of said barrier layer, and $t_{bj}$ is the thickness of the barrier layer, said $\Delta a_{wi}$, $\Delta a_{bj}$ and $\Delta$ respectively satisfy the following relationships:

$-2.0\% \leq \Delta a_{wi} < 0\%$,
$0\% < \Delta a_{bj} \leq +1.5\%$, and
$-3.6 \times 10^{-10}$ (meter) $\leq \Delta < 0$.

2. The semiconductor laser device according to claim 1, wherein the product of strain accumulated in said active layer and the layer thickness, $\Delta$, satisfies the following relationship:

$-3.38\times10^{-10}$ (meter)$\leq\Delta\leq-0.94\times10^{-10}$ (meter).

3. The semiconductor laser device according to claim 1 in which the product of strain accumulated in the active layer and the layer thickness $\Delta$ is $-3.38\times10^{-10}$m$\leq\Delta\leq-1.43\times10^{-10}$m.

4. In a semiconductor laser device comprising an active layer including a quantum well structure having a layered structure of a well layer and a barrier layer formed on a semiconductor substrate, and cladding layers provided with the active layer interposed therebetween, wherein the value of strain in said well layer, $\Delta a_{wi}$, is defined as $\Delta a_{wi}=(a_{wi}-a)/a$, the value of strain in said barrier layer, $\Delta a_{bj}$, is defined as $\Delta a_{bj}=(a_{bj}-a)/a$, and the product of strain accumulated in said active layer and the layer thickness ($t_{wi}$ and $t_{bj}$), $\Delta$, is calculated by the following equation:

$$\Delta = \sum_{i=1}^{n} \Delta a_{wi} \times t_{wi} + \sum_{j=1}^{m} \Delta a_{bj} \times t_{bj},$$

where a is the lattice constant of said semiconductor substrate, $a_{wi}$ is the lattice constant of said well layer, $t_{wi}$ is the thickness of the well layer, $a_{bj}$ is the lattice constant of said barrier layer, and $t_{bj}$ is the thickness of the barrier layer, said $\Delta a_{wi}$, $\Delta a_{bj}$ and $\Delta$ respectively satisfy the following relationships:

$-2.0\% \leq \Delta a_{wi} < 0\%$,
$0\% < \Delta a_{bj} \leq +1.5\%$, and
$-3.6 \times 10^{-10}$ (meter) $\leq \Delta < 0$, and wherein said semiconductor substrate is a GaAs substrate having a main surface misoriented by not less than 5° from a {100} plane of said substrate in a <011> direction, the composition of said well layer is $(Al_{x1}Ga_{1-x1})_{y1}In_{1-y1}P$, the composition of said barrier layer is $(Al_{x2}Ga_{1-x2})_{y2}In_{1-y2}P$, and x1 and x2 satisfy the relationship of $1.0 \geq x2 > x1 \geq 0$.

5. The semiconductor laser device according to claim 4, wherein said semiconductor substrate is a GaAs substrate having a main surface misoriented by not less than 5° nor more than 17° from the {100} plane in the <011> direction.

6. The semiconductor laser device according to claim 5, wherein in a case where said well layer comprises three layers each having a thickness of about 100 Å, the value of the strain in the well layer, $\Delta a_{wi}$, is $-1\%$, and the thickness of said barrier layer is about 40 Å, the value of the strain in the barrier layer, $\Delta a_{bj}$, satisfies the following relationship:

$0\% < \Delta a_{bj} \leq 1.29\%$.

7. The semiconductor laser device according to claim 5, wherein the value of the strain in said barrier layer, $\Delta a_{bj}$, satisfies the following relationship:

$0.12\% \leq \Delta a_{bj} \leq 1.29\%$.

8. The semiconductor laser device according to claim 5, wherein the value of the strain in said barrier layer, $\Delta a_{bj}$, satisfies the following relationship:

$0.33\% \leq \Delta a_{bj} \leq 0.98\%$.

9. In a semiconductor laser device comprising an active layer including a quantum well structure having a layered structure of a well layer and a barrier layer formed on a semiconductor substrate, and cladding layers provided with the active layer interposed therebetween, wherein the value of strain in said well layer, $\Delta a_{wi}$, is defined as $\Delta a_{wi} = (a_{wi} - a)/a$, and the value of strain in said barrier layer, $\Delta a_{bj}$, is defined as $\Delta a_{bj} = (a_{bj} - a)/a$, and the product of strains accumulated in said active layer and the layer thickness, $\Delta$, is calculated by the following equation:

$$\Delta = \sum_{i=1}^{n} \Delta a_{wi} \times t_{wi} + \sum_{j=1}^{m} \Delta a_{bj} \times t_{wj},$$

where a is the lattice constant of said semiconductor substrate, $a_{wi}$ is the lattice constant of said well layer, $t_{wi}$ is the thickness of the well layer, $a_{bj}$ is the lattice constant of said barrier layer, and $t_{bj}$ is the thickness of the barrier layer, and said $\Delta a_{wi}$, $\Delta a_{bj}$ and $\Delta$ respectively satisfy the following relationships:

$0\% < \Delta a_{wi} \leq 2.0\%$,
$-1.5\% \leq \Delta a_{bj} < 0\%$, and
$0 < \Delta \leq 2.6 \times 10^{-10}$ (meter).

10. The semiconductor laser device according to claim 9, wherein the product of the strains accumulated in said active layer and the layer thickness, $\Delta$, satisfies the following relationship:

$0.94 \times 10^{-10}$ (meter) $\leq \Delta \leq 3.38 \times 10^{-10}$ (meter).

11. The semiconductor laser device according to claim 9, wherein the product of the strains accumulated in said active layer and the layer thickness, $\Delta$, satisfies the following relationship:

$1.43 \times 10^{-10}$ meter $\leq \Delta \leq 2.98 \times 10^{-10}$ meter.

12. The semiconductor laser device according to claim 9, wherein in a case where said semiconductor substrate is a GaAs substrate having a main surface misoriented by not less than 5° from a {100} plane of said substrate in a <011> direction, the composition of said well layer is $(Al_{x1}Ga_{1-x1})_{y1}In_{1-y1}P$, and the composition of said barrier layer is $(Al_{x2}Ga_{1-x2})_{y2}In_{1-y2}P$, x1 and x2 satisfy the relationship of $1.0 \geq x2 > x1 \geq 0$.

13. The semiconductor laser device according to claim 12, wherein said semiconductor substrate is a GaAs substrate having a main surface misoriented by not less than 5° nor more than 17° from the {100} plane in the <011> direction.

14. In a semiconductor laser device comprising an active layer including a quantum well structure having well layers and barrier layers alternately layered on a semiconductor substrate, and cladding layers provided with the active layer interposed therebetween, the value of strain in each of said well layers is $-0.8\%$ to $-1.5\%$, the thickness of the well layer is 80 Å to 180 Å, the value of strain in each of said barrier layers is $+0.5\%$ to $+1.0\%$, and the thickness of the barrier layer is 20 Å to 60 Å, and the respective numbers of laminated well layers and barrier layers are 2 to 4.

15. The semiconductor laser device according to claim 14, wherein said semiconductor substrate is a GaAs substrate having a main surface misoriented by not less than 5° from a {100} plane of said substrate in a <011> direction, the composition of said well layer is $(Al_{x1}Ga_{1-x1})_{y1}In_{1-y1}P$, and the composition of said barrier layer is $(Al_{x2}Ga_{1-x2})_{y2}In_{1-y2}P$, x1 and x2 satisfy the relationship of $1.0 \geq x2 > x1 \geq 0$.

16. The semiconductor laser device according to claim 15, wherein said semiconductor substrate is a GaAs substrate having a main surface misoriented by not less than 5° nor more than 17° from the {100} plane in the <011> direction.

17. In a semiconductor laser device comprising an active layer including a quantum well structure having a layered structure of a well layer and a barrier layer formed on a semiconductor substrate, and cladding layers provided with the active layer interposed therebetween, wherein the value of strain in said well layer, $\Delta a_{wi}$, is defined as $\Delta a_{wi} = (a_{wi} - a)/a$, the value of strain in said barrier layer, $\Delta a_{bj}$, is defined as $\Delta a_{bj} = (a_{bj} - a)/a$, and the product of strain accumulated in said active layer and the layer thickness ($t_{wi}$ and $t_{bj}$), $\Delta$, is calculated by the following equation:

$$\Delta = \sum_{i=1}^{n} \Delta a_{wi} \times t_{wi} + \sum_{j=1}^{m} \Delta a_{bj} \times t_{bj},$$

where a is the lattice constant of said semiconductor substrate, $a_{wi}$ is the lattice constant of said well layer, $t_{wi}$ is the thickness of the well layer, $a_{bj}$ is the lattice constant of said barrier layer, and $t_{bj}$ is the thickness of the barrier layer, said $\Delta a_{wi}$, $\Delta a_{bj}$ and $\Delta$ respectively satisfy the following relationships:

$-2.0\% \leq \Delta a_{wi} < 0\%$,
$0\% < \Delta a_{bj} \leq +1.5\%$, and
$-2.98 \times 10^{-10}$ (meter) $\leq \Delta \leq -1.43 \times 10^{-10}$ (meter).

* * * * *